United States Patent
Goebel et al.

(10) Patent No.: US 11,456,494 B2
(45) Date of Patent: Sep. 27, 2022

(54) METHOD FOR EARLY DETECTION OF AN IMMINENT OVERHEATING OF AT LEAST ONE BATTERY CELL OF A BATTERY, DETECTION DEVICE, AND MOTOR VEHICLE

(71) Applicant: AUDI AG, Ingolstadt (DE)

(72) Inventors: Markus Goebel, Nassenfels (DE); Dominik Gottlieb, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 322 days.

(21) Appl. No.: 16/856,535

(22) Filed: Apr. 23, 2020

(65) Prior Publication Data

US 2020/0350642 A1  Nov. 5, 2020

(30) Foreign Application Priority Data

May 3, 2019 (DE) .......................... 102019206365.9

(51) Int. Cl.
*H01M 10/48* (2006.01)
*G01R 31/396* (2019.01)
*B60L 58/24* (2019.01)

(52) U.S. Cl.
CPC .......... *H01M 10/486* (2013.01); *B60L 58/24* (2019.02); *G01R 31/396* (2019.01); *B60L 2240/545* (2013.01); *H01M 2220/20* (2013.01)

(58) Field of Classification Search
CPC .......... B60L 2240/00; B60L 2240/545; B60L 58/00; B60L 58/24; B60L 58/10; B60L 3/00; B60L 3/0038; G01R 31/00; G01R 31/396; H01M 10/486; H01M 2220/20; H01M 2220/00; G05D 23/00; G05D 23/1902; G05D 23/1927; G01D 1/00; G01D 1/02; G01D 1/04; G01D 1/06; G01D 1/08; G01D 1/12; G01D 1/16; G01D 1/18; B60W 10/24; B60W 10/26

USPC .......................................................... 429/90
See application file for complete search history.

(56) References Cited

U.S. PATENT DOCUMENTS

| 8,831,904 | B2 * | 9/2014 | Houldsworth | ......... G01K 13/00 |
| | | | | 702/130 |
| 2007/0029976 | A1 * | 2/2007 | Garcia | ................... G01K 1/026 |
| | | | | 374/E1.005 |

FOREIGN PATENT DOCUMENTS

| DE | 102005058315 A1 | 6/2007 |
| DE | 102012205396 A1 | 10/2013 |
| DE | 102014221468 A1 | 4/2016 |
| DE | 102015206878 A1 | 10/2016 |
| DE | 102017103730 A1 | 9/2017 |
| DE | 102010045514 B4 | 3/2018 |

(Continued)

OTHER PUBLICATIONS

German Search Report dated Jan. 13, 2020 in corresponding German Application No. 102019206365.9; 20 pages; Machine translation attached.

*Primary Examiner* — Anthony R Jimenez
(74) *Attorney, Agent, or Firm* — Maier & Maier, PLLC

(57) ABSTRACT

A method for detecting an imminent overheating of at least one battery cell of a battery, preferably for a motor vehicle. The imminent overheating is detected as a function of at least one determined first variable relating to the at least one battery cell. A temperature gradient over time of a temperature sensed in a predetermined proximity to the at least one battery cell and/or a voltage of the at least one battery cell is determined as the at least one first variable.

13 Claims, 2 Drawing Sheets

(56) References Cited

FOREIGN PATENT DOCUMENTS

| DE | 102017009131 A1 | 3/2018 |
|----|-----------------|--------|
| DE | 102016222002 A1 | 5/2018 |
| EP | 2736100 A1      | 5/2014 |

\* cited by examiner

METHOD FOR EARLY DETECTION OF AN IMMINENT OVERHEATING OF AT LEAST ONE BATTERY CELL OF A BATTERY, DETECTION DEVICE, AND MOTOR VEHICLE

FIELD

The disclosure relates to a method for detecting an imminent overheating of at least one battery cell of a battery, preferably for a motor vehicle, the imminent overheating being detected as a function of at least one determined first variable relating to the at least one battery cell. The disclosure also includes a detection device and a motor vehicle having such a detection device.

BACKGROUND

Methods for monitoring electric energy accumulators, in particular motor vehicle batteries, are generally known from the prior art. Such monitoring is particularly relevant to safety, especially in connection with high-voltage batteries. Such monitoring can prevent damage from overheating or deep discharge or the like, for example, since countermeasures such as disabling the battery system can be performed at an early stage. Typical monitoring variables include, for example, the terminal voltages of battery cells and the cell temperatures of battery cells. DE 10 2010 045 514 B4, for example, describes a method for monitoring an electric energy accumulator according to which in the event of failure of a voltage sensor, the terminal voltage is estimated as the difference between a total terminal voltage and the sensed terminal voltages of the remaining cells, and based on the last terminal voltage of the battery cell concerned that was measured prior to the failure of the voltage sensor, a correction factor can be determined and taken into account.

DE 10 2012 205 396 A1 further describes a method for charge equalization of the charges between different battery cells, in which the charge equalization takes place in such a way that the heat generated during charge equalization is distributed as much as possible in space and time, so that no local overheating of or damage to components of the battery can occur.

DE 10 2017 103 730 A1 further describes a circuit and a method for the detection of battery degradation events, according to which an error signal is output if, during a discharge of a battery cell, a voltage change rate exceeds a threshold value more than a predetermined number of times over a predefined duration.

But the detection of imminent overheating, which is the primary subject matter of the present invention, plays a particularly significant role in connection with high-voltage batteries. In high-voltage battery systems, faults such as cell-internal short circuits can lead to an abnormal internal heating of cells. If, based on the design, this temperature increase is transferred by thermal conduction to other cells of the battery system, the temperature increase in neighboring cells can lead to a cell defect in these cells, which in turn causes them to heat internally. The result is a chain reaction, a so-called "thermal propagation", with the risk of smoke and even fire. To avoid this, or to at least enable a corresponding warning to be output as early as possible, it is particularly important to identify the beginning of such a spread of overheating as early as possible and to initiate appropriate measures, such as issuing a warning or disabling the battery system. With known systems, therefore, the temperature of the battery or of the battery cells is customarily monitored, and when a predetermined critical temperature is approached or exceeded, a measure is initiated.

In this connection, DE 10 2017 009 131 A1 describes a method for monitoring the temperature of a high-voltage battery in which temperature monitoring can be performed both in an active operating state and in an inactive operating state, and when a predetermined threshold value for temperature is exceeded, a control signal for a warning device of the high-voltage battery can be generated.

Various sensors, including infrared sensors for example, as described for example in EP 2 736 100 B1 and in DE 10 2005 058 315 A1, can also be used for temperature monitoring, along with sensors that are integrated into individual battery cells, for example, and use a thermochromic material, such as those described, for example, in DE 10 2016 222 002 A1.

SUMMARY

In the customary methods for detecting an imminent overheating, such overheating is detected or appropriate measures are initiated only when, for example, a predetermined critical temperature limit is exceeded. To enable an even earlier detection of such an imminent overheating, this critical temperature limit would have to be reduced accordingly. But this is possible only in very rare situations, since certain operating conditions of the battery, for example during rapid charging or during driving conditions that require high performance levels, can also lead to high cell temperatures or battery temperatures that do not represent the start of a spread of overheating in the battery, and would therefore lead to false alarms if the threshold value for critical temperature were to be reduced.

It is therefore the object of the present invention to provide a method for detecting an imminent overheating of at least one battery cell of a battery, a detection device, and a motor vehicle that will allow the earliest possible detection of an imminent, possible overheating of at least one battery cell.

This object is achieved by a method, by a detection device, and by a motor vehicle having the features of the respective independent claims. Advantageous embodiments of the invention are the subject matter of the dependent claims, the description, and the figures.

In a method according to the invention for detecting an imminent overheating of at least one battery cell of a battery for a motor vehicle, the imminent overheating is detected as a function of at least one determined first variable relating to the at least one battery cell. In said method, a temperature gradient over time of a temperature sensed in a predetermined proximity to the at least one battery cell and/or a voltage of the at least one battery cell is determined as the at least one first variable.

The invention is based on the insight that the start of a spread of an overheating of the at least one battery cell can be perceived much earlier in the corresponding cell voltage and in the temperature gradient than by the exceeding of a predetermined limiting temperature. Thus, by observing such a cell voltage or such a temperature gradient, an imminent overheating of a battery cell can advantageously be identified even before the sensed absolute temperature relating to the at least one battery cell approaches or exceeds a critical temperature limit. Therefore, by determining the temperature gradient over time and/or the voltage of the at least one battery cell, a significantly earlier detection of an imminent possible overheating of the at least one battery cell of the battery can be provided. This in turn has the significant advantage of extending the amount of time between the operator warning and a disabling of the system, giving the driver of a motor vehicle more time to maneuver to a parking space, if necessary, or to otherwise park his motor vehicle in a safe place. Since this advance warning time between the operator warning and a possible danger is correspondingly longer, safety can be increased since there is more time to safely leave the vehicle.

The battery, in particular for the motor vehicle, is preferably a high-voltage battery. This battery can further have a plurality of battery modules, with a respective battery module comprising at least one battery cell, but preferably having a plurality of such battery cells. Such a battery cell can further be configured, for example, as a lithium-ion cell. In general, the battery, which the at least one battery cell, the imminent overheating of which can be detected on the basis of a method according to the invention or one of the refinements thereof, but may also be a battery that is not installed in a motor vehicle, or a battery that is not intended for use in a motor vehicle, such as a stationary energy accumulator, an energy accumulator for a photovoltaic system, or the like. An imminent possible overheating can also be detected similarly in connection with such a battery by means of the invention and an early warning to an operator or the like can be output accordingly.

The detection of an imminent overheating can be understood in particular as the identification of the beginning of a spread of overheating in the battery, in particular in the at least one battery cell. The term "imminent overheating" should not be understood to mean that such an overheating will inevitably occur, but rather that such overheating, that is to say the exceeding of a predetermined critical temperature, by at least one of the battery cells of the battery will likely occur, at least if no countermeasures are initiated. However, it is conceivable that, based on the detection of such an imminent, possible, or probable, overheating, a measure might be initiated that will ensure that such overheating will not occur. Such a measure may involve, for example, a reduction in the power output of the battery system or the battery, the issuing of a warning message, in particular also informing the driver of such a reduction in power or the display of an error message, the disabling of the battery and/or the recording of a corresponding diagnosis in a battery control unit.

Countermeasures, however, such as the triggering of an extinguishing system or the like, do not necessarily have to be provided. Detected imminent overheating cannot always be prevented even by such countermeasures. However, through the capability for early detection of such an imminent overheating, the invention advantageously enables at least one timely warning to be issued to a driver or occupant of the motor vehicle, giving them enough time to leave the motor vehicle, for example, thereby avoiding danger to the occupants.

At least one sensor can also be used to determine the at least one first variable, in particular a temperature sensor for sensing the temperature in the predetermined proximity to the at least one battery cell, along with a voltage sensor for sensing the voltage of the at least one battery cell. The temperature gradient over time can then be determined in a simple manner on the basis of temperature values sensed in succession. The temperature gradient, in particular the temperature gradient over time, represents in particular the change in temperature within a predetermined time interval. The temperature gradient can also be understood as a mean adjusted temperature gradient, as will be described later in greater detail.

The temperature sensed in the predetermined proximity to the at least one battery cell can further be understood as the temperature that is sensed at the location of a temperature sensor positioned in this predetermined proximity to the at least one battery cell. In other words, it may be the temperature and the temperature value sensed directly and immediately by such a temperature sensor. However, the temperature sensed in the predetermined proximity to the at least one battery cell may also be a temperature value that is or was calculated based on the temperature measurements sensed by means of one or more temperature sensors located in proximity to the at least one battery cell for a location that is different from the location of these temperature sensors, which location may be closer to the at least one battery cell than the respective positions of the temperature sensors, or may even be located within the battery cell. In other words, the temperature of the battery cell itself can also be calculated on the basis of temperature measurements recorded by temperature sensors in proximity to said battery cell and, if appropriate, on the basis of a particular specification, such as a cell model or the like. This calculated cell temperature, which may be different from the temperature values sensed directly by means of the temperature sensors, can then likewise represent the aforementioned temperature sensed in the predetermined proximity to the at least one battery cell.

It is also particularly advantageous for the aforementioned variables, specifically the temperature gradient over time and/or the voltage, to be used as a monitoring variable in addition to the conventional observation of the temperature. Accordingly, in a particularly advantageous embodiment of the invention the imminent overheating is additionally sensed as a second variable that is different from the first variable and that relates to the at least one battery cell, as a function of the temperature sensed in the predetermined proximity to the at least one battery cell. To be able to identify such a possible imminent overheating at an early stage, it is therefore particularly advantageous to observe and to monitor the temperature in the predetermined proximity to the at least one battery cell itself, along with observing and monitoring the temperature gradient at that point and/or the voltage of the at least one battery cell. By considering all of these monitoring variables together, it is possible to provide a particularly reliable and early detection of such an imminent possible overheating.

The relevant variables can then be compared, for example, with corresponding limits. Therefore, in a further advantageous embodiment of the invention, for example, the voltage of only the individual battery cell is determined as the at least one first variable and is compared with at least one specified voltage limit, with the imminent overheating being detected when at least the condition is met that the determined voltage exceeds and/or falls below the at least one specified voltage limit. Based on the comparison of the determined voltage with a predetermined voltage limit, a voltage anomaly can advantageously be detected, which may indicate abnormal behavior of the at least one battery cell in question that could result in said battery cell possibly overheating. Thus, by comparing this determined voltage with such a voltage limit, it is advantageously also possible to provide a particularly early detection of such an imminent overheating. The consideration of individual battery cell voltages is of great advantage because the chain reaction described at the outset, specifically the "thermal propagation", does not at first appear simultaneously in all battery cells, and instead typically begins in one battery cell, for example due to a defect or short circuit or the like in said cell, and only then spreads from cell to cell. The beginning of such a spread can thus be identified primarily as a function of the difference in the value of the determined first variable for a battery cell in question as compared with the value of this variable for the remaining battery cells. In other words, the beginning of the spread of such an overheating is reflected much more significantly in a single cell voltage, specifically in the cell voltage of the battery cell that induces this spread, than in the consideration of an overall cell voltage of a cell network composed of a plurality of such battery cells, such as the total voltage of the battery.

Accordingly, a consideration of such a single cell voltage is advantageous particularly if the battery cell is not connected in parallel to at least one other battery cell of the battery. In that case, the cell voltage of this individual battery cell can also be sensed, and this can be done in a simple manner independently of the cell voltages supplied by other battery cells. Nevertheless, to sense the individual cell voltage of a battery cell that is in a parallel connection with other battery cells it would also be conceivable to separate this parallel connection temporarily in order to measure the individual battery cell and thus to determine the individual cell voltage independently of the other battery cells in the parallel network. The parallel network can be separated, for example, using switches, such as MOSFETs.

An anomaly in the individual cell voltage can also be identified both if this voltage falls below a voltage limit and, where appropriate, if it exceeds a further voltage limit. In other words, falling below a voltage limit and, similarly, exceeding a further voltage limit that is greater than the first-mentioned voltage limit may indicate an error that could be the cause of a spread of overheating in the battery. Accordingly, two voltage limits can also be established for the voltage in question, a lower voltage limit and an upper voltage limit, the lower voltage limit lying below a defined normal voltage of the battery cell, and the upper voltage limit lying above this normal voltage. These limits may be specified, for example, as a percentage based on the normal voltage of this individual battery cell. An undervoltage in the battery cell, i.e., for example, the cell voltage falling below the lower voltage limit, may indicate, for example, a possible short circuit inside the cell, which could induce the above-described overheating. Similarly, such an overheating may be induced by an overcharge of an individual battery cell, which can be ascertained from an overvoltage in said battery cell, i.e., a determined cell voltage that exceeds the upper voltage limit. It is therefore particularly advantageous to monitor the determined voltage of the at least one battery cell with regard to both exceeding of an upper limit and falling below a lower limit.

In a further advantageous embodiment of the invention, the temperature gradient over time is determined as the at least one first variable and is compared with at least one specified gradient limit, with the imminent overheating being detected when at least the condition is met that the determined temperature gradient exceeds the at least one specified gradient limit. If the temperature of the at least one battery cell increases very significantly, in particular excessively, within a short period of time, which can be determined based on the comparison of the determined temperature gradient with the specified gradient limit, this likewise indicates the beginning of the spread of overheating. For example, if temperature gradients over time of around 2 degrees Celsius per minute typically occur within the battery, and if a temperature gradient over time of between 10 degrees Celsius and 15 degrees Celsius per minute, for example, is then ascertained at one position, this is a clear indication that the at least one battery cell is about to overheat. In particular, under certain circumstances such significant temperature increases, i.e., such large temperature gradients over time that would lead to overheating, may occur even if the absolute temperature of the at least one battery cell or in the predetermined proximity to the at least one battery cell is not yet roughly within a critical temperature range and/or does not differ significantly from the temperature in the predetermined proximity to other battery cells. Therefore, the determined temperature gradient also does not necessarily have to be compared with a specified, for example predetermined gradient limit, but may also be compared, for example, with temperature gradients prevailing at other positions within the battery in order to detect local anomalies at an early stage, as will be explained later in detail.

In a further advantageous embodiment of the invention, the specified gradient limit is determined and specified as a function of the current temperature sensed in the predetermined proximity to the at least one battery cell. In other words, the gradient limit itself can in turn be selected from the absolute temperature currently prevailing in the predetermined proximity to the at least one battery cell. The higher this temperature is, the lower the established gradient limit can be, for example, and vice versa; i.e., the lower the absolute temperature in proximity to the at least one battery cell, the higher the relevant gradient limit specified for the temperature gradient can be. In other words, an imminent possible heating can be considered to be detected if at a relatively high temperature, the temperature gradient is still relatively low, and conversely, if a relatively large temperature gradient over time in the sense of a temperature increase is ascertained while the temperature is still relatively low. Both situations can lead to overheating in approximately the same amount of time. The monitoring of both the absolute temperature and the temperature gradient and the selection of an adapted gradient limit as a function of the current temperature thus enables the early identification of a possible overheating that is particularly adapted to the situation in a wide variety of situations.

In a particularly advantageous embodiment of the invention, a critical temperature limit, for example between 110 degrees Celsius and 140 degrees Celsius, is specified, and a duration limit is also specified, wherein as a function of the determined temperature gradient and the determined current temperature in the predetermined proximity to the at least one battery cell, an estimated duration until the specified critical temperature limit is reached is determined and is compared with the specified duration limit, wherein the imminent overheating is detected when at least the condition is met that the determined estimated duration falls below the duration limit. Based on the current temperature and the current temperature gradient, extrapolation can thus be used, for example, to determine when a specified critical temperature limit is likely to be reached. If the length of time extrapolated in this way is shorter than a specified length of time described by the duration limit, the imminent overheating can be regarded as detected. This has the great advantage that it allows a minimum length of time required by the driver between the issuing of a warning and the disabling of the battery system, for example, to enable him to safely park and/or leave the motor vehicle, for example, to be explicitly specified as this duration limit. A duration of minutes in the single-digit range, for example between three and six minutes, for example five minutes, is preferably specified as such a duration limit. Thus if it is determined, based on the currently sensed temperature and the currently determined temperature gradient, that the critical temperature limit is likely to be reached in fewer than these specified five minutes, then a corresponding warning can be issued to the driver immediately, so that the driver can be warned early, in particular by approximately these five minutes, before a possible danger, for example due to overheating of the battery system, might occur. The extrapolation for determining this length of time remaining until the specified critical temperature is reached need not be linear, but may, for example, also be attained non-linearly, for example exponentially. For the most accurate extrapolation, for example, the temperature curve, along with the temperature gradient curve over time, can be factored in over multiple previous time increments based on temperature values and/or temperature gradients over time sensed during these multiple previous time increments. In other words, a change over time in the temperature gradient over time can also be factored into the extrapolation.

This advantageous embodiment of the invention makes it possible to initiate appropriate measures, above all the issuing of a warning message, in a targeted manner before a predetermined point in time, which lies a very definite length of time before the point in time at which the critical temperature is likely to be exceeded. This is particularly advantageous if the spread of overheating can no longer be halted by various countermeasures, such as reducing the power output, without disabling the battery system, or perhaps can even no longer be halted. Precisely in such situations, the prompt issuing of a warning message still enables the driver to safely park the motor vehicle and safely leave the motor vehicle.

As was already mentioned above, it is advantageous not only to determine the stated variables, such as the absolute temperature, the temperature gradient, and also the individual cell voltage, at a given point or for an individual battery cell and to use them to detect the imminent overheating, but rather to determine and analyze these variables, for example, at different positions within the battery and/or for some or all of the battery cells of the battery. Therefore, in a further advantageous embodiment of the invention, multiple temperature gradients over time are determined as the at least one first variable as a function of multiple respective temperature values for different positions in the predetermined proximity to the at least one battery cell, and a respective one of the temperature gradients over time is calculated as a mean adjusted temperature gradient. This mean adjusted temperature gradient can then either be compared with a specified gradient limit and/or compared with the mean value or with a gradient limit that is established as a function of the mean value. This advantageously makes it possible to detect local temperature anomalies particularly reliably. As was already described above, the beginning of the spread of overheating within the battery typically occurs locally and can therefore be detected particularly reliably and early based on such a local observation of the temperature gradient, i.e., based on the observation of one temperature gradient in comparison with the remaining determined temperature gradients, and this for a respective temperature gradient. This can be done in a particularly simple manner by considering the above-described mean adjusted temperature gradient. Such a mean adjusted temperature gradient represents, in particular, the difference between the relevant temperature gradient determined at one position and the mean value, which was calculated by averaging all the determined temperature gradients over time. Global temperature fluctuations, which can sometimes be very large due to an abrupt demand for power, for example, are thus reflected in the respective temperature gradients in approximately the same way, and thus also in the corresponding mean value. Advantageously, such temperature fluctuations then do not erroneously lead to an early detection of imminent overheating. Thus this measure advantageously reduces the occurrence of false alarms.

In a further advantageous embodiment of the invention, multiple respective voltages, each for one of multiple battery cells of the battery, are determined as the at least one first variable, and multiple temperature gradients over time are determined based on multiple respective temperature values for different positions in the predetermined proximity to the at least one battery cell, wherein a check is made to determine whether at least one of the following conditions is met:

at least one of the multiple current temperature values sensed for the different positions exceeds a specified temperature limit;

at least one temperature gradient of the multiple temperature gradients exceeds a specified gradient limit;

at least one determined duration of a plurality of estimated durations until a specified critical temperature is reached, determined based on the respective temperature gradients, in particular the specified critical limiting temperature described above, falls below a specified duration limit;

at least one of the multiple current voltages reaches a specified voltage limit at least one of multiple calculated temperature differences between a respective one of the multiple sensed current temperature values and a mean value of these multiple sensed current temperature values exceeds a specified temperature difference limit.

The imminent overheating is considered detected if at least one of these conditions is met.

Thus, an imminent overheating can advantageously be sensed within the battery on the basis of four different criteria, wherein this imminent heating is deemed to be detected if and only if at least one of these criteria is met. Alternatively, however, it may also be provided that multiple of these criteria or conditions must be met for an imminent overheating to be deemed to be detected. The consideration of all these criteria enables a particularly reliable and comprehensive and, above all, early detection of an imminent possible overheating.

In addition to the conditions already explained above, in particular as it pertains to the cell voltage and/or the temperature gradient over time, it may also be a further condition that the difference between at least one of the multiple current temperature values sensed and the mean value of these multiple current temperature values sensed exceeds a predetermined specified temperature limit. This enables even local temperature anomalies to be detected particularly early, even if the absolute temperature at one position of this anomaly is still relatively low, but is nevertheless significantly higher than the mean temperature value.

The invention further also relates to a detection device for a motor vehicle for detecting an imminent overheating of at least one battery cell of a battery, the detection device having a control unit, which is designed to detect the imminent overheating on the basis of at least one determined first variable that relates to the at least one battery cell. Said at least one first variable represents a temperature gradient over time of a temperature sensed in a predetermined proximity to the at least one battery cell and/or a voltage of the at least one battery cell.

The detection device for sensing the voltage of the at least one battery cell and/or for sensing the temperature in order to determine the temperature gradient over time can further have at least one sensor, for example a voltage sensor and/or temperature sensor. Preferably, the detection device comprises a plurality of such sensors, in particular a plurality of temperature sensors and/or voltage sensors. The voltage sensors can be configured, for example, to detect the respective individual battery cell voltages, i.e., a respective voltage sensor can also be assigned to a respective one of a plurality of battery cells of the battery, for example, which voltage sensor intermittently senses the relevant cell voltage of the assigned battery cell, and then provides this voltage to the control unit for further analysis. Accordingly, the battery can also have a plurality of spatially distributed temperature sensors that intermittently sense corresponding temperature values at the relevant positions and then provide these to the control unit for further analysis. Based on the temperature values, the control unit can then intermittently determine the corresponding temperature gradient and can monitor it or use it to detect an imminent overheating.

Apart from that, the advantages described for the method according to the invention and the embodiments thereof also apply similarly to the detection device according to the invention.

The invention also includes refinements of the detection device according to the invention, which have features as have already been described in connection with the refinements of the method according to the invention. For that reason, the corresponding refinements of the detection device according to the invention will not be described again here.

In addition, a battery, in particular a high-voltage battery, having such a detection device according to the invention or one of the embodiments thereof should also be regarded as part of the invention.

The invention further relates to a motor vehicle having a detection device according to the invention or one of the embodiments thereof.

The motor vehicle according to the invention is preferably embodied as an automobile, in particular as a passenger vehicle or truck, or as a passenger bus or motorcycle.

The invention also comprises the combinations of the features of the described embodiments.

BRIEF DESCRIPTION OF THE DRAWINGS

In the following, exemplary embodiments of the invention will be described. Concerning these embodiments.

DETAILED DESCRIPTION

The exemplary embodiments described in the following are preferred embodiments of the invention. In the exemplary embodiments, the described components of the embodiments each represent individual features of the invention that are to be viewed independently of one another and that further refine the invention independently of one another. The disclosure is therefore also intended to include combinations of the features of the embodiments other than those described. The described embodiments can also be enhanced by other features of the invention that have already been described.

In the figures, the same reference signs are used to denote elements that have the same function.

Figure 1:
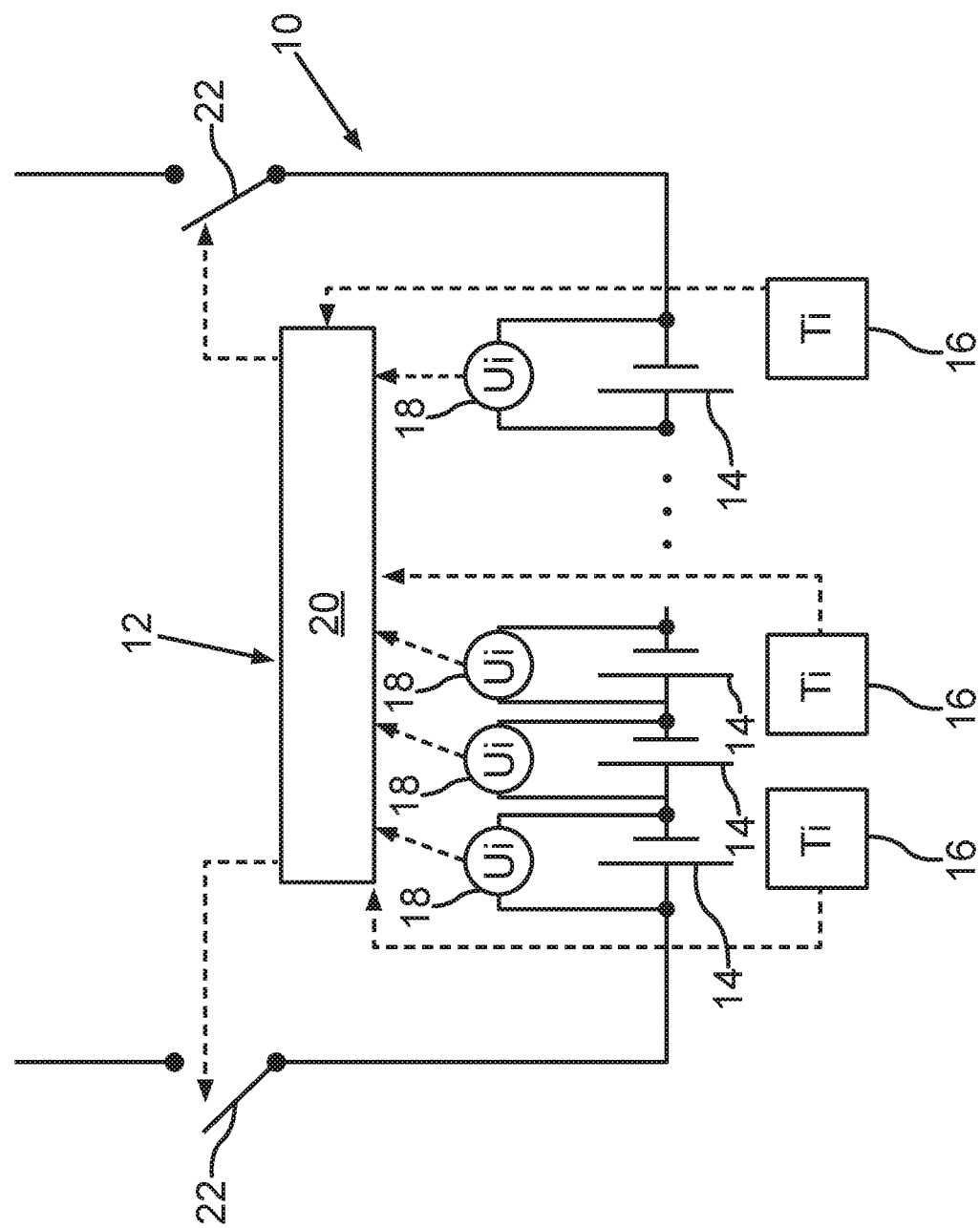
FIG. 1 shows a schematic diagram of a battery having a detection device for detecting an imminent overheating of at least one battery cell of the battery, according to one exemplary embodiment of the invention.

FIG. 1 shows a schematic diagram of a battery 10, in particular a high-voltage battery for a motor vehicle, having a detection device 12 for detecting an imminent overheating of at least one battery cell 14 of the battery 10 according to an exemplary embodiment of the invention. The battery 10 can in particular comprise a plurality of battery modules, not explicitly depicted here, which can in turn have a plurality of battery cells 14. In the present example, only a small number of battery cells 14 are shown. These battery cells 14 can generally be arranged in any series and/or parallel connection to one another. The battery 10, in particular the detection device 12, further has a plurality of sensors. In this example, these include a plurality of temperature sensors 16, which sense the temperature Ti at various positions within the battery 10, in particular each in predetermined proximity to the relevant battery cells 14, in particular continually, for example intermittently at specifiable measuring time intervals, or continuously. The number of temperature sensors 16 need not necessarily match the number of battery cells 14. In particular, either more or fewer temperature sensors 16 than battery cells 14 may be provided. The detection device 12 further has a plurality of voltage sensors 18. A respective voltage sensor 18 is assigned to a respective battery cell 14 and senses the respective individual cell voltage Ui of the relevant, assigned battery cell 14, in particular likewise continuously or intermittently at predetermined measuring time intervals. The measurements sensed by the respective sensors 16, 18 are correspondingly transmitted intermittently to a control unit 20 of the detection device 12. Said control unit analyzes the transmitted measurements and, on the basis of this analysis, determines whether a possible overheating of at least one of the battery cells 14 is imminent or whether a spread of such a possible overheating has already begun. This verification or detection of the imminent overheating will be explained in greater detail below in reference to FIG. 2. If the control unit 20 determines accordingly that an overheating of at least one of the battery cells 14 is imminent, the control unit 20 can initiate further measures that will likewise be described in greater detail below. One of these measures, for example, is to disable the battery system 10 or to decouple the battery 10 from the remainder of the motor vehicle's electrical system, which can be done by opening the main battery contactor 22. These main contactors 22 can therefore likewise be actuated by the control unit 20 as such a measure to detect an imminent overheating, and can be opened accordingly. Before the battery system is disabled, however, a timely warning is preferably issued to the driver of the motor vehicle to allow him sufficient time, for example, to bring the motor vehicle to a stop in a position on the shoulder. However, this requires the earliest possible detection of an imminent overheating, as is advantageously made possible by the invention and the embodiments thereof, and as will now be described in greater detail in reference to FIG. 2.

Figure 2:
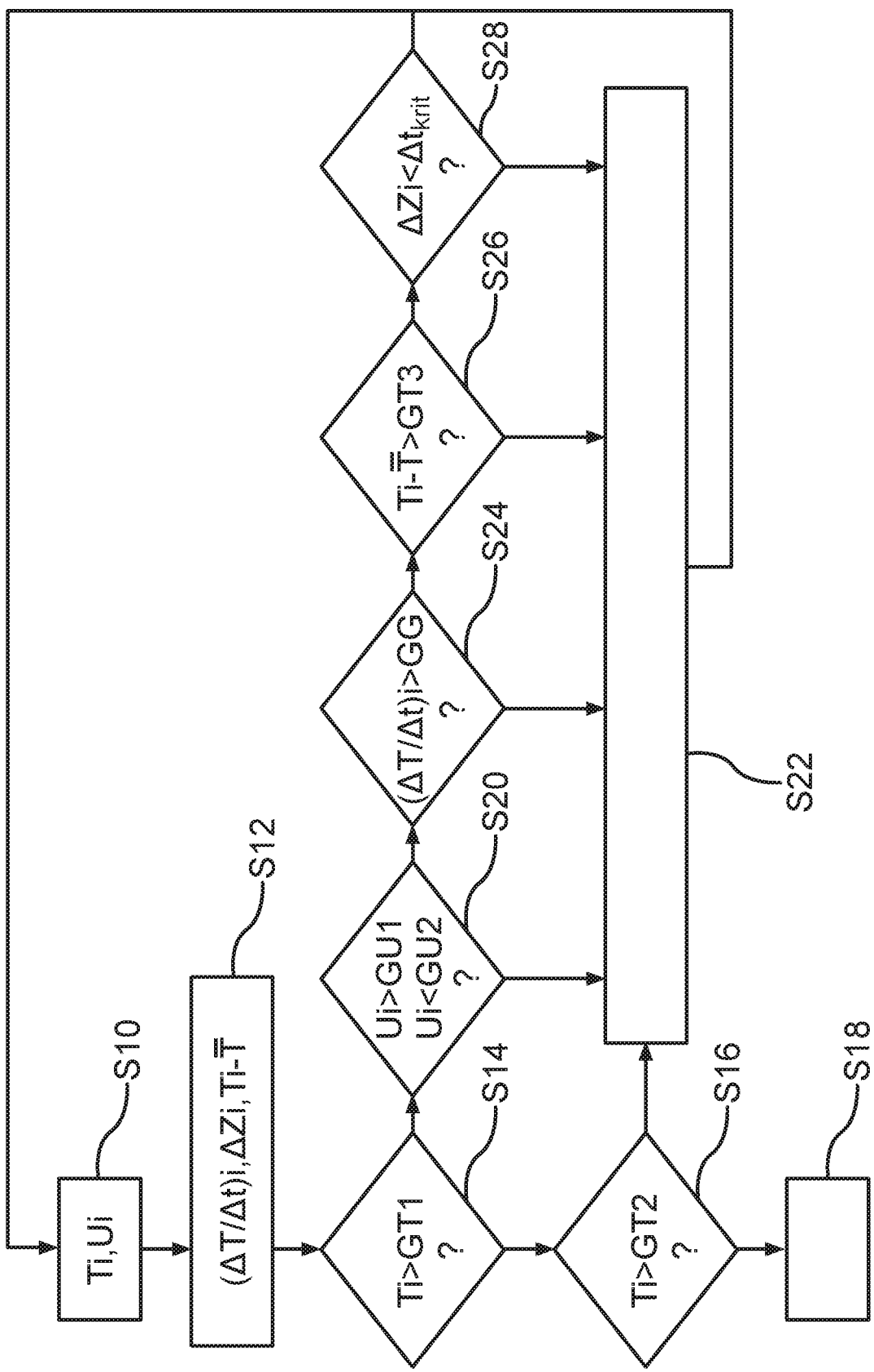
FIG. 2 shows a flowchart illustrating a method for detecting an imminent overheating of at least one battery cell of a battery according to one exemplary embodiment of the invention.

FIG. 2 shows a flowchart illustrating a method for detecting an imminent overheating of at least one of the battery cells 14 according to an exemplary embodiment of the invention. The method described below can be carried out in particular by means of the detection device 12, in particular by means of the control unit 20 of the detection device 12.

The method begins in step S10, in which the current sensor measurements, specifically the sensed temperatures Ti, along with the current individual cell voltages Ui are provided to the control unit 20. Using these provided measured variables as a basis, additional monitoring variables can then advantageously be derived or determined in step S12. A particularly advantageous one of these monitoring variables is the temperature gradient $(\Delta T/\Delta t)i$. This variable represents, in particular, the change in the temperature $\Delta T$ within a given time interval $\Delta t$, for example the time interval $\Delta t$ between two measuring steps at which the temperature Ti is sensed by a respective temperature sensor 16. To determine the temperature gradient $(\Delta T/\Delta t)i$, at least two temperature values Ti recorded in succession for a relevant position are required. Since the temperature values Ti are continuously or intermittently sensed by a respective temperature sensor 16, as has already been described in reference to FIG. 1, the temperature gradient $(\Delta T/\Delta t)i$ can be determined in a simple manner, factoring in the temperature value Ti recorded immediately previously, for example.

Another particularly advantageous monitoring variable is the predicted duration $\Delta Zi$ until a specified critical temperature GT2 is reached, as will be described in greater detail later in reference to step S16. This predicted duration $\Delta Zi$ can likewise be determined as a function of a determined current temperature value Ti and the temperature gradient $(\Delta T/\Delta t)i$ associated with this position. If this critical temperature limit GT2 is 120 degrees Celsius, for example, and if a current temperature Ti of 80 degrees Celsius is measured at a specific position, and if a current positive temperature gradient $(\Delta T/\Delta t)i$ of 10 degrees Celsius per minute, for example, is determined for the same position, then assuming a linear further temperature increase according to the determined temperature gradient $(\Delta T/\Delta t)i$, the stated duration $\Delta Zi$ can be determined as four minutes, in particular according to the formula:

$$(GT2-Ti)/(\Delta T/\Delta t)i=(120°\ C.-80°\ C.)/(10°\ C./1\ min)$$
$$=4\ min.$$

In this way, it can be estimated, for example, how long it will take until a specified critical temperature GT2 is reached.

A further suitable monitoring variable is the difference between a current temperature value Ti and the mean value $\overline{T}$, which is formed from all the temperature values Ti currently sensed at a respective time increment. Based on the measured variables Ti, Ui sensed directly in step S10 and based on the variables derived therefrom in step S12, early detection of a possible overheating of at least one of the battery cells 14 can now be detected particularly advantageously. For this purpose, the relevant values can be compared with corresponding limits, as will be described in greater detail below.

For example, in step S14 a check can first be made to determine whether the current temperature Ti is greater than a predetermined first temperature limit GT1. This check can be carried out in particular for all of the respective sensed temperature values Ti. If at least one of these temperature values Ti is above said first limit GT1, a further check can be carried out in step S16 to determine whether the relevant temperature value(s) Ti is/are also above a second predetermined temperature limit GT2, the critical temperature limit, for example 120 degrees or 130 degrees Celsius. This second temperature limit GT2 is greater than the aforementioned first temperature limit GT1. If at least one of the currently sensed temperatures Ti is above this second temperature limit GT2, a corresponding measure, in particular a disabling of the battery system, for example by opening the main contactor 22, can then be carried out immediately in step S18. This is the last possible measure to prevent a supercritical situation, in particular a battery fire. If possible, however, additional measures should be initiated much earlier so that such a disablement does not have to occur at all or at least so that a timely warning can be issued to the driver. This can now be accomplished as follows:

Usually, in order for a chain reaction to be triggered at all the temperature Ti at the relevant battery cell 14 or at a position in a predetermined proximity to such a battery cell 14 must first increase gradually from a significantly lower value, in particular below the first limit GT1. In other words, before such a spread of overheating begins, the sensed temperature values Ti are still below the first limit GT1. Therefore, in step S14 the process can first proceed to step S20, in which a check is first made to determine whether the voltage values Ui sensed for the respective battery cells 14 at a respective time increment either exceed a predetermined first limit GU1 or at least one of the sensed voltages Ui, or whether at least one of the sensed voltage values Ui is below a predetermined second voltage limit GU2. In this way, voltage anomalies can be detected, which can likewise be used as an indication of an imminent overheating. For example, if such an overvoltage or undervoltage is detected in step S20, at least for one of the aforementioned battery cells 14, an imminent overheating can be considered to be detected and accordingly, an appropriate early measure can be initiated in step S22, for example a warning can be issued to the driver and/or for example the power to the motor vehicle can be limited. Monitoring can then begin again in step S10 for the next time increment. However, if no voltage anomaly is found in step S20, a further check can be made in step S24 to determine whether at least one of the determined temperature gradients $(\Delta T/\Delta t)i$ exceeds a predetermined gradient limit GG. If that is the case, the process can likewise return to step S22 and an early measure can be initiated. Otherwise, in step S26 a further check can be made to determine whether at least one of the determined temperature differences between a respective current temperature Ti and the temperature mean value $\overline{T}$ is greater than a certain third temperature limit GT3. This third temperature limit GT3 is likewise lower than the previously described second temperature limit GT2 and in particular is also lower than the first temperature limit GT1 mentioned. If that is the case, the process moves back to step S22; otherwise, in step S28 a check is made to determine whether a respective predicted duration $\Delta Zi$ is shorter than a predetermined duration limit $\Delta t_{crit}$. Such a predicted duration $\Delta Zi$ can also be determined separately for the respective positions where the temperature sensors 16 are arranged, and accordingly a comparison such as is carried out in step S28 can be carried out for a respective duration $\Delta Zi$ predicted in this manner. If at least one of the predicted durations determined in this way is shorter than the aforementioned duration limit $\Delta t_{crit}$, an early measure can in turn be initiated in step S22. Otherwise, the method starts at the beginning again in step S10 for the next time increment.

Early identification of an imminent overheating can thus be provided overall on the basis of numerous advantageous monitoring variables. This enables appropriate measures to be initiated at a particularly early stage, in particular before the high-voltage system or the high-voltage battery 10 has to be disabled completely. In this way, for example, the driver of the motor vehicle can be made aware of such a possible imminent overheating at a particularly early stage, and can be warned accordingly, giving him significantly more time to find a suitable parking space or some other position where the motor vehicle can be parked safely before the battery 10 is disabled and in particular before the further spread of overheating can lead to more serious consequences. This also allows the driver to leave the motor vehicle in good time, even if an overheating of the battery 10 and more serious consequences, such as a battery fire, can no longer be prevented. Based on these advantageous monitoring variables, in particular the temperature gradient and/or the additionally observed individual cell voltages, safety can thus be significantly increased.

Taken together, the examples demonstrate how the invention can be used to identify the start of the spread of overheating in a high-voltage battery, in which, by the observation, in particular the additional observation, of the temperature gradient over time and/or the individual cell voltage, a significant increase in safety is made possible.

The invention claimed is:

1. A method for detecting an imminent overheating of at least one battery cell of a battery, comprising:
    detecting a plurality of temperatures sensed in predetermined proximities to the at least one battery cell,
    calculating a temperature gradient over time for each of the plurality of temperatures,
    calculating a mean adjusted temperature gradient based on the plurality of temperature gradients, and
    normalizing the plurality of temperature gradients based on the mean adjusted temperature gradient,
    wherein the imminent overheating is detected when one or more of the plurality of temperature gradients so normalized exceed a predetermined gradient limit.

2. The method according to claim 1, further comprising extrapolating, based on one or more of the plurality of temperature gradients, a duration required for one or more of the at least one battery cell to exceed a critical temperature limit,
    wherein, when the at least one battery cell are below the critical temperature limit, the imminent overheating is detected when the duration so extrapolated falls below a predetermined duration limit.

3. The method according to claim 1, wherein the predetermined gradient limit is based on one or more of the plurality of temperature gradients prevailing at other locations in the battery.

4. A detection device for a motor vehicle for detecting an imminent overheating of at least one battery cell of a battery, the detection device comprising circuitry configured to execute the method according to claim 1.

5. The method according to claim 1, wherein the predetermined gradient limit is based on one or more of the plurality of temperatures, such that the predetermined gradient limit is reduced as one or more of the plurality of temperatures approaches a critical temperature limit.

6. The method according to claim 5, further comprising extrapolating, based on one or more of the plurality of temperature gradients, a duration required for one or more of the at least one battery cell to exceed a critical temperature limit,
    wherein, when the at least one battery cell are below the critical temperature limit, the imminent overheating is detected when the duration so extrapolated falls below a predetermined duration limit.

7. The method according to claim 5, further comprising detecting a voltage of one or more of the at least one battery cell,
    wherein the imminent overheating is detected when the voltage exceeds and/or falls below a predetermined voltage limit.

8. The method according to claim 7, wherein a parallel connection of the one or more of the at least one battery cell are temporarily separated to measure the voltage.

9. The method according to claim 1, further comprising detecting a voltage of one or more of the at least one battery cell,
    wherein the imminent overheating is detected when the voltage exceeds or falls below a predetermined voltage limit.

10. The method according to claim 9, wherein a parallel connection of the one or more of the at least one battery cell are temporarily separated to measure the voltage.

11. The method according to claim 10, wherein the parallel connection is separated via a switch.

12. The method according to claim 1, wherein one or more of the plurality of temperature gradients are calculated based on a specification of one or more of the at least one battery cell such that the one or more of the plurality of temperature gradients calculated differs from that which is measured.

13. The method according to claim 12, further comprising extrapolating, based on one or more of the plurality of temperature gradients, a duration required for one or more of the at least one battery cell to exceed a critical temperature limit,
    wherein, when the at least one battery cell are below the critical temperature limit, the imminent overheating is detected when the duration so extrapolated falls below a predetermined duration limit.

* * * * *